(12) United States Patent
Limb

(10) Patent No.: US 10,038,267 B2
(45) Date of Patent: Jul. 31, 2018

(54) CIRCUIT INTERCONNECT SYSTEM AND METHOD

(71) Applicant: Palo Alto Research Center Incorporated, Palo Alto, CA (US)

(72) Inventor: Scott J. Limb, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 764 days.

(21) Appl. No.: 14/302,888

(22) Filed: Jun. 12, 2014

(65) Prior Publication Data

US 2015/0364848 A1    Dec. 17, 2015

(51) Int. Cl.

| | |
|---|---|
| *H01R 13/24* | (2006.01) |
| *C22F 1/00* | (2006.01) |
| *H05K 1/11* | (2006.01) |
| *B41J 2/16* | (2006.01) |
| *B23K 26/38* | (2014.01) |
| *B23K 26/402* | (2014.01) |

(Continued)

(52) U.S. Cl.
CPC ......... *H01R 13/2414* (2013.01); *B23K 26/38* (2013.01); *B23K 26/402* (2013.01); *B41J 2/1631* (2013.01); *B41J 2/1639* (2013.01); *C22F 1/006* (2013.01); *H01L 41/0475* (2013.01); *H01L 41/29* (2013.01); *H01R 4/01* (2013.01); *H05K 1/111* (2013.01); *B23K 2203/42* (2015.10); *B23K 2203/50* (2015.10); *B41J 2/1433* (2013.01); *B41J 2/162* (2013.01); *B41J 2/1623* (2013.01); *B41J 2/1628* (2013.01); *B41J 2/1642* (2013.01); *H01L 41/047* (2013.01); *H01L 2924/01078* (2013.01); *H01L 2924/01079* (2013.01); *H01R 12/79* (2013.01); *H05K 1/112* (2013.01); *H05K 1/115* (2013.01)

(58) Field of Classification Search
CPC ...... H01R 13/2414; H01R 4/01; H01R 12/79; B23K 26/38; B23K 26/402; B23K 2203/42; C22F 1/006; H01L 41/0475; H01L 41/29; H01L 2924/01079; H01L 2924/01078; B41J 2/162; B41J 2/1433; B41J 2/1623; B41J 2/1628; B41J 2/1631; B41J 2/1639; B41J 2/1642; H05K 1/111; H05K 1/112; H05K 1/115
See application file for complete search history.

(56) References Cited

U.S. PATENT DOCUMENTS 8,303,093 B2    11/2012    Dolan et al.
8,465,659 B2     6/2013    Dolan et al.
(Continued)

*Primary Examiner* — Timothy Thompson
*Assistant Examiner* — Paresh Paghadal
(74) *Attorney, Agent, or Firm* — Hollingsworth Davis, LLC

(57) ABSTRACT

A circuit interconnect generally comprises an electrical connection pad, a shape memory material, and a flowable conductor. The electrical connection pad has an upper surface, a portion of which is covered by the shape memory material. The flowable conductor extends through the shape memory material and is electrically coupled to the electrical connection pad. The shape memory material has a first configuration at a first temperature and a second configuration at a second temperature. In the instance of the second temperature being greater than the first, the shape memory material has a first configuration that is substantially planar and a second configuration that is cupped.

18 Claims, 5 Drawing Sheets

(51) Int. Cl.
*H01R 4/01* (2006.01)
*H01L 41/29* (2013.01)
*B41J 2/14* (2006.01)
*H01L 41/047* (2006.01)
*B23K 103/00* (2006.01)
*H01R 12/79* (2011.01)

(56) References Cited

U.S. PATENT DOCUMENTS

| | | | |
|---|---|---|---|
| 8,556,611 B2 | 10/2013 | Dolan et al. | |
| 8,585,187 B2* | 11/2013 | Nystrom | B41J 2/14233 |
| | | | 29/25.35 |
| 2002/0046856 A1* | 4/2002 | Alcoe | H05K 3/3436 |
| | | | 174/534 |
| 2002/0100973 A1* | 8/2002 | Akram | H01L 24/11 |
| | | | 257/734 |
| 2003/0098899 A1* | 5/2003 | Jung | B41J 2/14 |
| | | | 347/54 |
| 2005/0242437 A1* | 11/2005 | Moxham | H01L 23/13 |
| | | | 257/738 |
| 2010/0207266 A1* | 8/2010 | Chang | H01L 21/563 |
| | | | 257/692 |
| 2013/0061469 A1* | 3/2013 | Dolan | B41J 2/14233 |
| | | | 29/830 |
| 2013/0147881 A1* | 6/2013 | Redding | B41J 2/14233 |
| | | | 347/71 |

* cited by examiner

CIRCUIT INTERCONNECT SYSTEM AND METHOD

BACKGROUND

Drop on demand ink jet technology is widely used in the printing industry. Various types of technology may be used to implement drop on demand ink jet printing. One of the more common technologies utilizes printheads with piezoelectric ink jets.

Piezoelectric ink jet printheads typically include a flexible diaphragm, contained within a jetstack body, and an array of transducers, i.e., piezoelectric elements, attached to the diaphragm. When a voltage is applied to a transducer, typically through electrical connection with an electrode electrically coupled to a voltage source, the transducer bends or deflects, causing the diaphragm to flex which expels a quantity of ink from a chamber through a nozzle. The flexing further draws ink into the chamber from a main ink reservoir through an opening to replace the expelled ink.

The electrode, described above, typically protrudes as a pad electrode from a flexible printed circuit and is typically electrically connected to the transducer via a conductive material such as a silver epoxy. An adhesive standoff layer operates to contain the conductive material atop the transducer and enables attachment/adhesion between the flexible printed circuit and the transducer. As the adhesive layer is cured the pad electrode of the flexible printed circuit is drawn towards the transducer compressing the conductive material and causing it to flow to any open area on the transducers upper surface. Under ideal circumstances, the compressed conductive material provides a broad contact surface for the pad electrode ensuring an optimal electrical connection between the electrode and the transducer. However, in the real world, ideal circumstances are not always present.

SUMMARY

A circuit interconnect generally comprises an electrical connection pad, a shape memory material, and a flowable conductor. The electrical connection pad has an upper surface, a portion of which is covered by the shape memory material. The flowable conductor extends through the shape memory material and is electrically coupled to the electrical connection pad. The shape memory material has a first configuration at a first temperature and a second configuration at a second temperature. In the instance of the second temperature being greater than the first, the shape memory material has a first configuration that is substantially planar and a second configuration that is cupped.

The circuit interconnect may additionally incorporate a corresponding first and second configuration of the flowable conductor. The first configuration presents the flowable conductor in an arcuate configuration atop the substantially planar configuration of the shape memory material and the second configuration presents the flowable conductor in a balled configuration that is partially contained by the cup configuration of the shape memory material. The portion of the flowable conductor not contained by the cup configuration extends in an arcuate presentation above the rim of the cup shape. Further, the circuit interconnect may include a standoff adhesive layer, the flowable conductor may comprise a silver epoxy, the electrical connection pad may comprise a piezoelectric ink jet printhead transducer, the balled configuration of the flowable conductor may also be configured as a flex-circuit electrical contact, and the balled configuration of the flowable conductor may be of a higher aspect ratio than the arcuate configuration of the flowable conductor.

An interconnect system of the present disclosure generally comprises a transducer, a flex-circuit and a conductor. The flex-circuit is secured to the transducer and incorporates an electrically conductive pad. The conductor is partially contained by a cup-shaped memory material but extends through the cup-shaped memory material to establish electrical communication between the transducer and the conductive pad of the flex-circuit. The interconnect system may additionally include a transducer that comprises a piezoelectric ink jet printhead transducer, a conductor that is a flowable conductor capable of conforming to the cup-shaped shape memory material, a cup-shaped shape memory material that is formed by heating a substantially planar configuration of the material, and a conductor that is a high aspect ratio conductor.

A method of the present disclosure generally comprises securing a shape memory material atop an electrical connection pad, depositing a flowable conductor atop and through the shape memory material to electrically couple the flowable conductor to the electrical connection pad, and heating the shape memory material to form a cup configuration where a portion of the flowable conductor is contained by the cup configuration and wherein a portion of the flowable conductor extends above the cup configuration to present a flex-circuit pad bondable contact. The method may further comprise heating the shape memory material from a substantially planar configuration to form the cup configuration.

The above summary is not intended to describe each embodiment or every implementation. A more complete understanding will become apparent and appreciated by referring to the following detailed description and claims in conjunction with the accompanying drawings.

DETAILED DESCRIPTION

Figure 1:
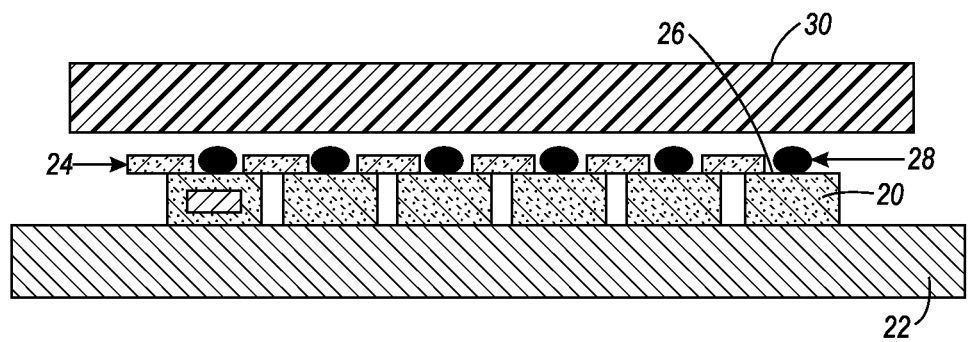
FIGS. 1-2 are cross-sections depicting the formation of a transducer interconnect for piezoelectric ink jet printheads according to standard practices.
Figure 2:
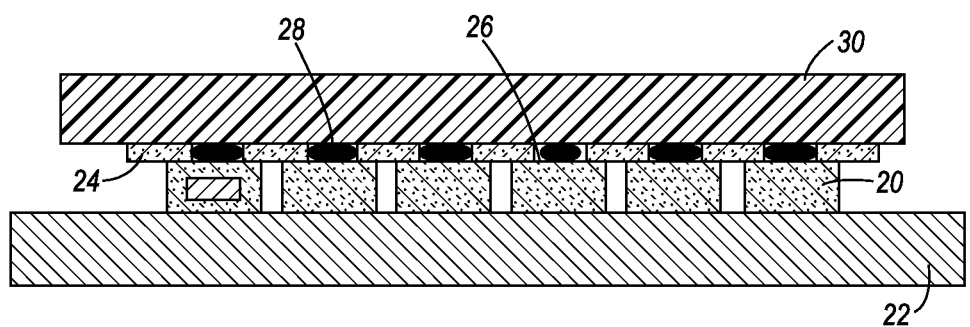

In the manufacture of piezoelectric ink jet printheads, transducers 20 are typically secured to the jetstack body 22 of the printhead, see FIG. 1. The transducers 20 are typically piezoelectric elements comprising PZT (lead zirconate titanate). After the transducer 20 attachment to the jetstack body 22, a patterned standoff layer 24 (for example, a 1 mil adhesive) is applied to the edges of each of the transducers 20 leaving a central opening to expose a large portion of the upper surface 26 of each transducer 20. Next, a drop of a flowable conductor 28 (for example, a silver epoxy) is dispensed into each central opening and establishes an electrically conductive contact with the upper surface 26 of the transducer 20. Pad electrodes (not shown) of a flexible printed circuit (flex-circuit) 30 are then aligned with the central openings to position the pad electrode directly over the drop of flowable conductor 28. Upon subjecting the afore-described configuration to a curing temperature, see FIG. 2, the flex-circuit 30 and pad electrodes are drawn downward towards the underlying transducer 20 causing the drop of flowable conductor 28 to compress and spread across the open, upper surface 26 of the transducer 20 creating a transducer electrical contact. Note that the standoff layer 24 is intended to contain the spreading conductor 28 to the desired location atop the transducer 20. With the pad electrode touching the transducer electrical contact, electrical communication between the pad electrode/flex-circuit 30 and the transducer 20 is established. The electrical communication is maintained by the adherence of the flex-circuit 30 to the underlying transducer 20 via the cured, adhesive standoff layer 24.

Figure 3:
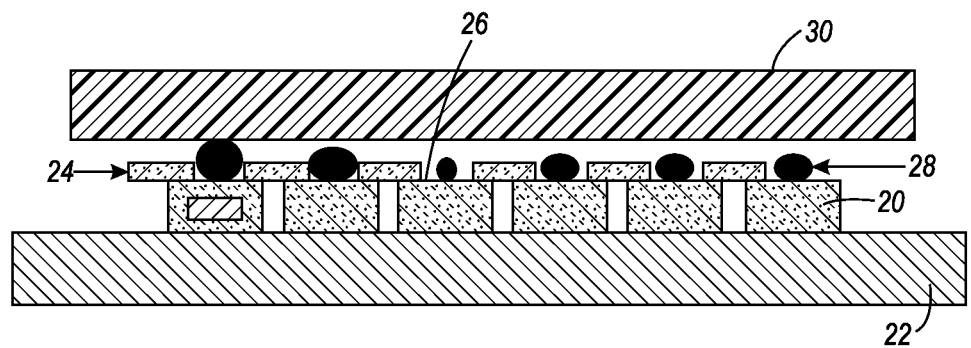
FIGS. 3-4 are cross-sections depicting the formation of a transducer interconnect for piezoelectric ink jet printheads according to standard practices and the limitations associated therewith.
Figure 4:
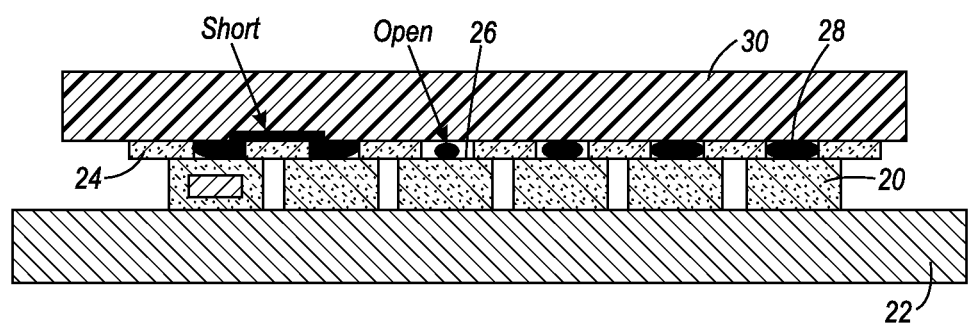

While the manufacturing process described above is an accepted practice, it is not without its limitations. One area of consideration is the dispensation of the flowable conductor. Referring now to FIGS. 3-4, the volume of conductor 28 dispensed can vary and this variation tends to increase with increased volume. Too little conductor 28 volume can result in electrical opens due to poor adhesion and reduced contact area between the pad electrodes of the flex-circuit 30 and the transducers 20. Too much conductor volume can result in overflow creating shorts between adjacent transducers 20. Moreover, as ink jet printhead nozzle density increases, more and more transducers 20 are placed within a defined space, the decreased dimension/spacing between transducers 20 causes an increased occurrence of the described opens and shorts.

In view of the above, embodiments of the present disclosure are presented with reference to FIGS. 5-9 and describe a system 10 and method 100 for a high aspect ratio circuit interconnect that is appropriate for use with, for example, transducers in piezoelectric ink jet printheads. However, the system and method are equally applicable to any application that utilizes an electrical connection pad from which electrical coupling is to be established.

Figure 5:
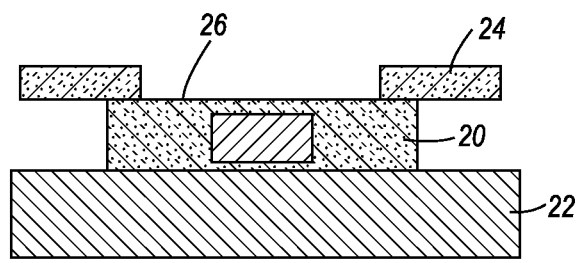
FIGS. 5-8 are cross-sections depicting the formation of a high-aspect ratio transducer interconnect for piezoelectric ink jet printheads according to various embodiments.

Referring now to FIG. 5, the system 10 is established with an electrical connection pad, in this instance, a transducer 20 secured to a jetstack body 22. A full height (for example, 1 mil) adhesive, standoff layer 24 is applied to the outer edges of the transducer 20. According to one embodiment, the transducer 20 is a piezoelectric element comprised of PZT (lead zirconate titanate).

Figure 6A:
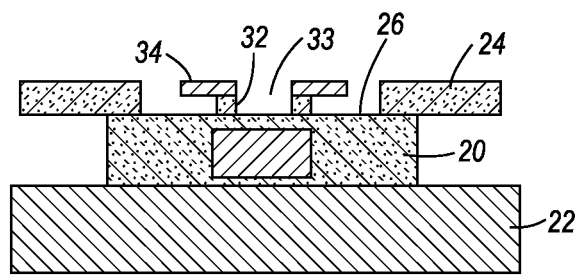
Figure 6B:
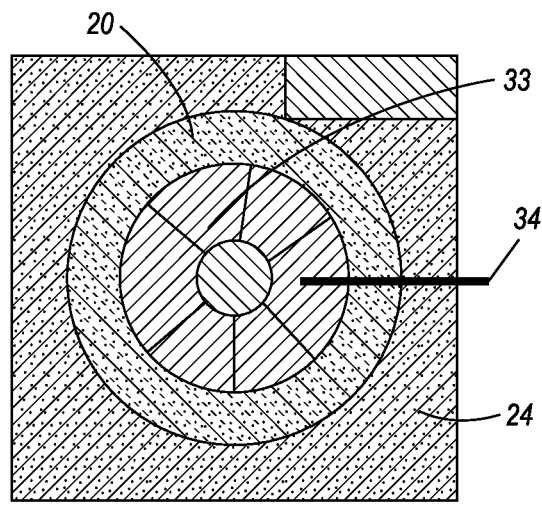

Subsequently, per FIGS. 6A and 6B, a second patterned adhesive standoff layer 32 is applied to the top surface 26 of the transducer 20. Standoff layer 32 is approximately half the thickness/height of standoff layer 24 and is positioned to the center of transducer 20 in a circular configuration presenting an open center 33. Standoff layer 32 provides support and adhesion for a patterned shape memory polymer layer 34 positioned atop standoff layer 32 in a planar, widened circular configuration, see FIG. 6B, that maintains open center 33 providing a path to the top surface 26 of the underlying transducer 20. It should be noted that the shape memory polymer has been manufactured to a desired pattern, length, width and depth prior to being applied to the standoff layer 32. The desired shape memory polymer may be manufactured via any suitable means including, but not limited to, being punched out with a die and/or laser cut.

Figure 7:
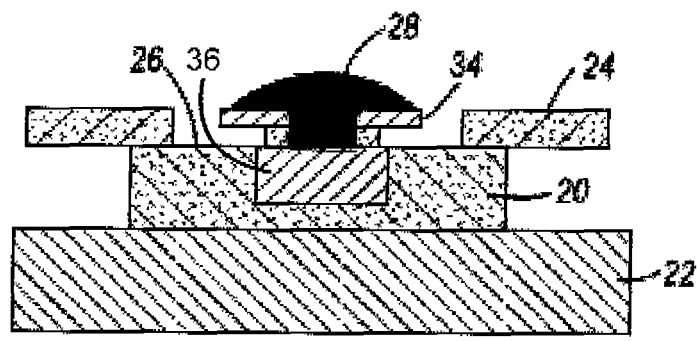

Referring now to FIG. 7, a drop of flowable conductor 28 (for example, silver epoxy), is placed atop the shape memory polymer layer 34, wherein the drop of conductor 28 flows through open center 33 to contact an electrical connection pad 36 of the transducer 20 and flows outward to the outer edges of the circularly-configured shape memory layer 34 thereby presenting the flowable conductor 28 in an arcuate configuration atop the shape memory layer 34. A notably less amount of flowable conductor 28 is needed for the present configuration as compared to the configuration of FIG. 1. As such, overflow of the flowable conductor is not a significant concern. With the flowable conductor 29 deposited, the configuration of FIG. 7 is subjected to a temperature increase, i.e., a curing temperature that may cure both the shape memory polymer layer 34 and the flowable conductor 28.

Figure 8:
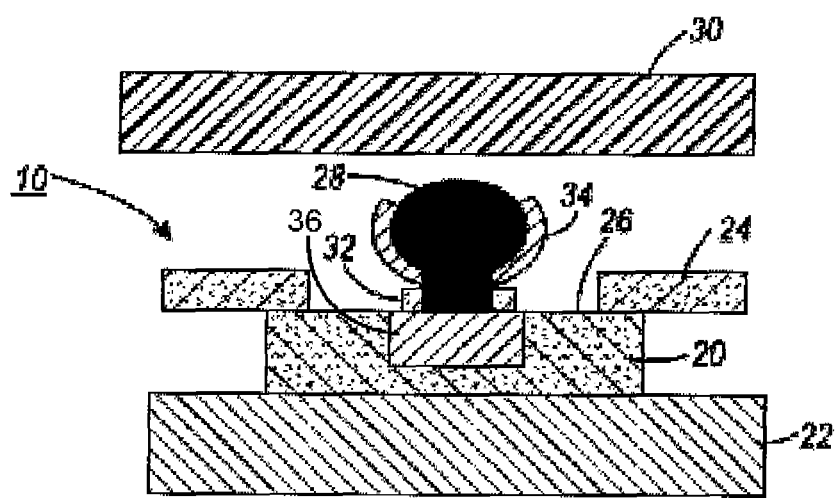

The heat activates the shape memory polymer layer 34 causing it to pull upward into a cup configuration, see FIG. 8. The flowable conductor 28 conforms to the cup configuration, while maintaining contact with the upper surface 26 of the transducer 20, by presenting a balled configuration that is partially contained by the cup-shaped memory polymer layer 34. The portion of conductor 28 not contained by the cup-shaped memory polymer layer 34 extends above the upper rim of the cup in an arcuate presentation thereby completing the configuration of system 10.

The balled conductor 28 of the system 10 presents a high aspect ratio electrical contact i.e., a smaller volume dispensed during manufacture to conserve conductor and to prevent conductor overflow, yet a taller structure to make adequate electrical contact. Furthermore, the balled conductor 28 is in a configuration that will conform to the electrode pads of the flex-circuit 30 during the bonding/adhesion process of securing flex-circuit 30 to the transducer 20 through use of adhesive standoff layer 24. It should be noted that while FIGS. 5-8 illustrate a single transducer configuration for clarity, the same configuration may be applied to a plurality of transducers as appropriate to the specific ink jet printhead configuration in which the transducer is used. Further, the application of system 10 need not be limited to printers but can easily be extended to any application utilizing interconnect circuitry such as flexible printed circuits, ribbon cable, etc.

Figure 9:
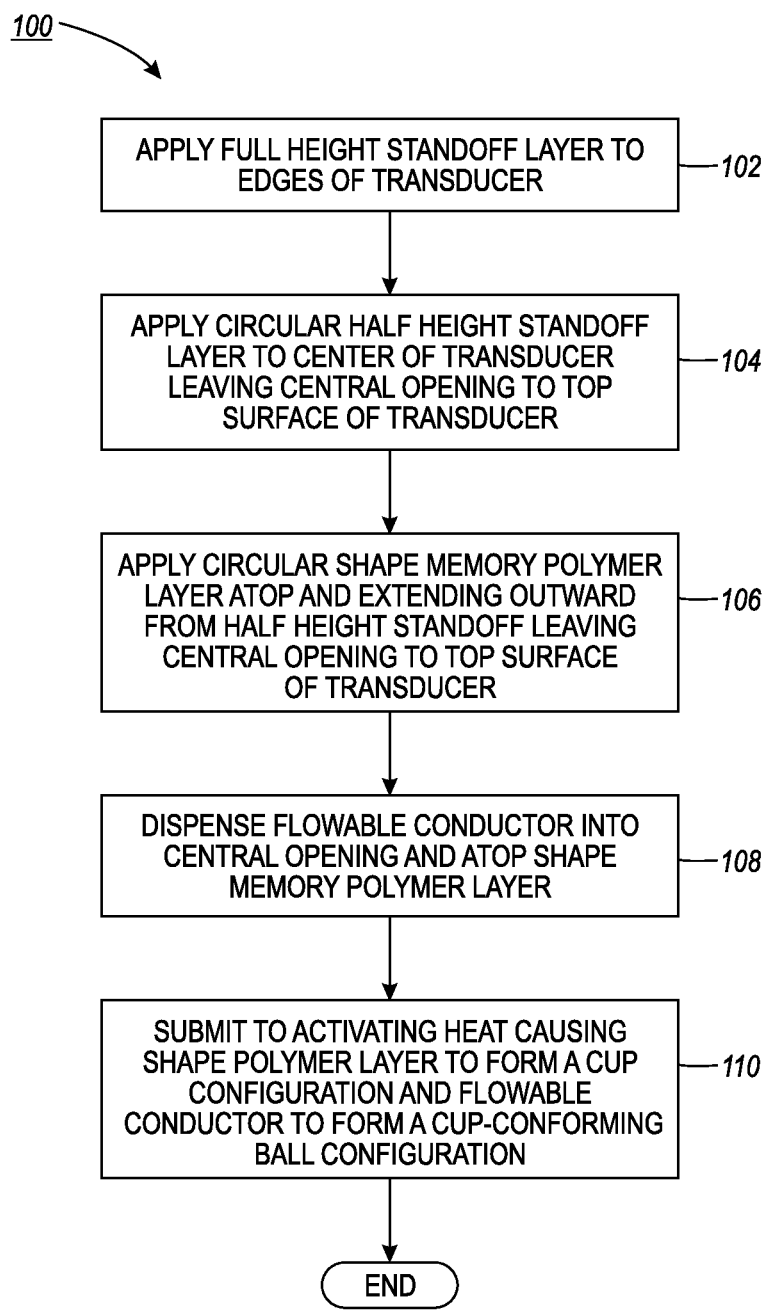
FIG. 9 is a flowchart diagramming the process for manufacturing a high-aspect ratio transducer interconnect for piezoelectric ink jet printheads according to various embodiments The figures are not necessarily to scale. Like numbers used in the figures refer to like components. However, it will be understood that the use of a number to refer to a component in a given figure is not intended to limit the component in another figure labeled with the same number.

FIG. 9 is a flowchart illustrating a method 100 for creating a high aspect ratio contact suitable for bonding with a flex-circuit according to various embodiments. Initially, a full height, first adhesive standoff layer is applied to the edges of a transducer, 102. A half-height, second standoff adhesive layer is applied in a circular configuration atop the transducer while maintaining a central opening, 104. A shape memory polymer layer is applied atop the second standoff adhesive in a circular configuration, maintaining the central opening, and extending outwards toward the first adhesive standoff layer, 106. A flowable conductor is dispensed to the central opening where it flows down to the transducer and outward to the edge of the shape memory polymer layer, 108. The transducer with the two standoff layers, shape memory polymer and flowable conductor are submitted to an increase in temperature whereby the heat activates the shape memory polymer to form a cup configuration and the flowable conductor to present a cup-conforming ball configuration, 110, suitable for contacting and conforming to a flex-circuit.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality.

Various modifications and additions can be made to the disclosed embodiments discussed above. Accordingly, the scope of the present disclosure should not be limited by the particular embodiments described above, but should be defined only by the claims set forth below and equivalents thereof.

The invention claimed is:

1. A circuit interconnect, comprising:
a transducer having an electrical connection pad, the electrical connection pad having an upper surface;
a shape memory material covering a first portion of the upper surface;
a flowable conductor extending through the shape memory material to electrically couple to the electrical connection pad; and
a patterned stand-off adhesive layer disposed between the electrical connection pad and the shape memory material, the patterned stand-off adhesive layer having a planar circular configuration with an open center,
wherein the shape memory material has a first configuration at a first temperature and a second configuration at a second temperature.

2. The circuit interconnect of claim 1, wherein the second temperature is greater than the first temperature.

3. The circuit interconnect of claim 1, wherein the first configuration is substantially planar and the second configuration is cupped.

4. The circuit interconnect of claim 3, wherein the flowable conductor has a corresponding first and second configuration, wherein the first configuration presented the flowable conductor in a substantially arcuate configuration atop the substantially planar configuration of the shape memory material and wherein the second configuration presents the flowable conductor in a balled configuration substantially contained within the shape memory material cupped configuration.

5. The circuit interconnect of claim 4, wherein the cup configuration of the shape memory material is defined by an upper rim and wherein the balled configuration of the flowable conductor presents a substantially arcuate portion above the upper rim.

6. The circuit interconnect of claim 1, further comprising a second stand-off adhesive layer covering a portion of the upper surface of the electrical connection pad.

7. The circuit interconnect of claim 1, wherein the flowable conductor comprises a silver epoxy.

8. The circuit interconnect of claim 1, wherein the transducer comprises an ink jet printhead piezoelectric transducer.

9. The circuit interconnect of claim 1, wherein the transducer comprises lead zirconate titanate (PZT).

10. The circuit interconnect of claim 4, wherein the balled configuration of the flowable conductor further comprises a flex-circuit contact configuration.

11. The circuit interconnect of claim 4, wherein the balled configuration of the flowable conductor is of a higher aspect ratio than the arcuate configuration of the flowable conductor.

12. The apparatus of claim 1, further comprising a second stand-off adhesive layer covering a portion of the upper surface of the electrical connection pad, wherein a height of the second stand-off adhesive layer is about twice a height of the patterned stand-off adhesive layer.

13. An interconnect system comprising:
a transducer having an electrical connection pad;
a flex-circuit secured to the transducer and having an electrically conductive pad;
a conductor, partially contained by a cup-shaped memory material, wherein the conductor extends through the cup shaped memory material to establish electrical coupling between the electrical connection pad of the transducer and the electrically conductive pad of the flex-circuit; and
a patterned stand-off adhesive layer disposed between the electrical connection pad and the cup-shaped memory material, the patterned stand-off adhesive layer having a planar circular configuration with an open center.

14. The interconnect system of claim 13, wherein the transducer comprises an ink jet printhead piezoelectric transducer.

15. The interconnect system of claim 13, wherein the conductor comprises a flowable conductor capable of conforming to the cup-shaped memory material.

16. The interconnect system of claim 13, wherein the cup shape of the shape memory material is established by heating a planar configuration of the shape memory material.

17. The interconnect system of claim 13, wherein the conductor is a high-aspect ratio conductor, the conductor having a connection distance between the flex-circuit and the transducer, the connection distance defining a conductor height, wherein the conductor width is substantially perpendicular to the conductor height, and wherein conductor height is greater than the conductor width.

18. The interconnect system of claim 13, wherein the cup-shaped shape memory material is secured to the transducer.

* * * * *